United States Patent
Schuhmacher et al.

(10) Patent No.: US 9,040,167 B2
(45) Date of Patent: May 26, 2015

(54) METHOD FOR THE PRODUCTION OF A FLAT STEEL PRODUCT AND FLAT STEEL PRODUCT

(75) Inventors: Bernd Schuhmacher, Dortmund (DE); Christian Schwerdt, Duisburg (DE); Nicole Weiher, Bochum (DE); Richard Weinhold, Neuss (DE)

(73) Assignee: ThyssenKrupp Steel Europe AG, Duisburg (DE)

( * ) Notice: Subject to any disclaimer, the term of this patent is extended or adjusted under 35 U.S.C. 154(b) by 613 days.

(21) Appl. No.: 13/321,212

(22) PCT Filed: May 20, 2010

(86) PCT No.: PCT/EP2010/056974
§ 371 (c)(1),
(2), (4) Date: Jan. 31, 2012

(87) PCT Pub. No.: WO2010/136383
PCT Pub. Date: Dec. 2, 2010

(65) Prior Publication Data
US 2012/0129001 A1 May 24, 2012

(30) Foreign Application Priority Data
May 25, 2009 (DE) .......... 10 2009 022 515

(51) Int. Cl.
| | |
|---|---|
| B32B 15/01 | (2006.01) |
| B32B 15/04 | (2006.01) |
| B32B 15/18 | (2006.01) |
| B32B 15/20 | (2006.01) |
| C25D 7/06 | (2006.01) |
| C25D 5/50 | (2006.01) |
| C23C 14/02 | (2006.01) |
| C23C 30/00 | (2006.01) |
| C22C 1/02 | (2006.01) |
| C22C 38/00 | (2006.01) |
| C23C 14/16 | (2006.01) |
| C23C 14/58 | (2006.01) |
| C23C 28/02 | (2006.01) |

(52) U.S. Cl.
CPC ....... *C23C 14/025* (2013.01); *Y10T 428/12736* (2015.01); *Y10T 428/12757* (2015.01); *Y10T 428/12972* (2015.01); *Y10T 428/265* (2015.01); *Y10T 428/12799* (2015.01); *Y10T 428/12729* (2015.01); *C23C 30/005* (2013.01); *C25D 7/0614* (2013.01); *B32B 15/18* (2013.01); *B32B 15/20* (2013.01); *B32B 15/012* (2013.01); *B32B 15/013* (2013.01); *C22C 1/02* (2013.01); *C22C 38/00* (2013.01); *C23C 14/16* (2013.01); *C23C 14/5806* (2013.01); *C23C 28/023* (2013.01); *C25D 5/50* (2013.01); *C23C 28/021* (2013.01); *C23C 28/025* (2013.01); *C23C 28/028* (2013.01)

(58) Field of Classification Search
CPC .... B32B 15/01; B32B 15/012; B32B 15/013; B32B 15/017; B32B 15/043; B32B 15/20; B32B 15/04; B32B 15/18; C22C 1/02; C22C 38/00; C23C 14/024; C23C 14/025; C23C 14/16; C23C 14/165; C23C 14/5806; C23C 28/02; C23C 28/021; C23C 28/023; C23C 28/025; C23C 30/00; C23C 30/005; C23C 28/028; Y10T 428/12757; Y10T 428/12736; Y10T 428/12972; Y10T 428/265; Y10T 428/12799; Y10T 428/12729
USPC .................. 428/659, 653, 649, 650, 684, 336
See application file for complete search history.

(56) References Cited

U.S. PATENT DOCUMENTS

| | | | |
|---|---|---|---|
| 7,998,535 | B2 | 8/2011 | De Meyer et al. |
| 2009/0139872 | A1* | 6/2009 | Weiher et al. .................. 205/220 |

FOREIGN PATENT DOCUMENTS

| | | |
|---|---|---|
| DE | 10039375 A1 | 3/2002 |
| DE | 10257737 B3 | 2/2004 |
| DE | 102005045780 A1 | 4/2007 |
| EP | 0780485 A1 | 6/1997 |
| EP | 1570115 B1 | 4/2006 |
| EP | 1664368 B1 | 3/2009 |
| WO | 2006089832 A1 | 8/2006 |
| WO | WO 2007/033992 * | 3/2007 |
| WO | 2009059950 A2 | 5/2009 |

OTHER PUBLICATIONS

Schuhmacher et al., "Novel coating systems based on PVD for steel sheet", Vakuum in Forschung und Praxis, 2001, pp. 233-235, No. 4.

* cited by examiner

*Primary Examiner* — Michael E La Villa
(74) *Attorney, Agent, or Firm* — The Webb Law Firm

(57) ABSTRACT

A flat steel product having a base layer of a steel material and a multilayer coating applied thereto, and a method for producing the flat steel product. The method having the following steps: providing a steel base layer; applying a zinc layer to the base layer by electrolytic coating; applying an aluminum layer to the surface of the zinc layer, wherein no treatment is made to the surface of the zinc layer in regard to the oxides and sulfides present thereon at the end of the electrolytic zinc coating step or occurring during the course of the aluminum coating step; applying a magnesium layer to the aluminum layer; and subsequently heat treating the flat steel product in such a way that an $MgZn_2$ layer forms in the coating above the Al layer.

14 Claims, No Drawings

METHOD FOR THE PRODUCTION OF A FLAT STEEL PRODUCT AND FLAT STEEL PRODUCT

BACKGROUND OF THE INVENTION

1. Field of the Invention

The invention relates to a method for producing a flat steel product that is formed from a base layer consisting of a steel material and a multilayer anticorrosion coating applied thereto.

In addition the invention relates to a flat steel product that is formed from a base layer consisting of a steel material and a multilayer coating applied thereto.

2. Description of the Related Art

Metallic coatings have long been used to protect steel sheets and plates against corrosion. In recent years, in addition to pure zinc or aluminium coatings binary and ternary layer systems have increasingly been used for this purpose. Compared to pure zinc or aluminium coatings these offer, apart from an optimised corrosion protection, also improved properties with regard to adhesion, abrasion, weldability and workability.

Ternary alloy coatings of zinc, aluminium and magnesium, possibly with an admixture of minor amounts of silicon, are normally produced by hot-dip coatings. In this connection the layer thicknesses of 4-10 µm are in a range in which difficulties are encountered in practice when welding flat steel products coated in this way. This applies in particular to laser welding with zero joining gap, which has proved to be critical in the case of steel sheets provided with comparatively thick ternary coatings.

Thinner anticorrosion coatings with nevertheless a high degree of protection can be produced if a steel substrate, i.e. a steel strip or a steel sheet, is first of all electrolytically coated with a zinc layer, onto which a magnesium layer is then additionally applied. The magnesium is then incorporated by alloying into the zinc layer by means of a heat treatment, with the formation of $Zn_2Mg$. The coating of the electrolytically galvanised steel sheet with Mg can be carried out for example by means of physical vapour deposition (PVD) in vacuo.

The zinc-magnesium coatings thereby obtained, based on Mg-vapour deposited electrolytically galvanised steel sheet, have outstanding anticorrosion properties and enable the coating thickness to be significantly reduced, which has a positive effect in particular with regard to the weldability.

As regards practical production a difficulty and complication with the ZnMg layer systems however is that the zinc surface must as far as possible be completely free from oxidic or sulphidic particles before the vapour deposition with magnesium. Failing this, the result is a poor adhesion of the zinc-magnesium layer after the thermal post-treatment.

The requirement for a surface that is largely oxide-free and sulphide-free conflicts in practice however with the fact that in the course of the electrolytic coating and subsequent contact with the ambient atmosphere oxides and sulphides are formed under operating conditions. Before the deposition of the magnesium layer on the zinc layer such oxides and sulphides must therefore be removed again from the surface of the zinc layer.

One possibility of a corresponding treatment is to subject the Zn surface to a plasma fine purification before the vapour deposition in a vacuum. For this, the surface is bombarded with argon ions, so that the oxides present there are stripped out. In practice the plasma fine purification as described in EP 0 780 485 B1 (DE 696 10 064 T2) can be carried out as reverse magnetron sputter etching.

The plasma fine purification has the advantage that it can be controlled comparatively easily. Such a plasma fine purification is therefore as a rule used in all known coating methods in which a metal is vapour deposited on a substrate under a vacuum.

Having regard to the conditions that prevail in the processing of flat steel products, the known methods for plasma fine purification are however very complicated and costly to employ on a large scale. For example, on the one hand high investment costs are required for the necessary plant technology. At the same time these plants have only very short service lives and require short maintenance intervals, since the surface material abraded by the ion bombardment remains in the plant. The surface material therefore has to be removed at short intervals in order to avoid contamination of the flat product being processed in each case with residues remaining in the plasma fine purification plant.

In order to circumvent the costly and complicated plasma fine purification, it has been proposed in DE 10 2005 045 780 A1 to pass the flat steel product to be coated through a cascade sink after the electrolytic Zn coating, in order likewise to remove the oxides present on the surface of the Zn coating. The Mg layer is then deposited on the thus purified Zn layer and a thermal post-treatment is carried out under optimised operating parameters. This is intended to ensure that, despite the omission of the plasma fine purification, a sufficient adhesion of the ZnMg coating to the steel substrate is achieved. The process window of the annealing to be maintained in this connection is however so narrow that under practical conditions it is difficult to maintain this with the necessary degree of accuracy.

SUMMARY OF THE INVENTION

Against this background the object of the invention was to provide a method that under practical conditions enables a flat steel product to be provided with a ZnMg coating in a comparatively simple manner that not only adheres well, offers a good corrosion protection and can be readily worked, but can also be adjusted so thin that the flat steel product provided with such a coating has a good weldability.

In addition a flat steel product should be provided that under practical conditions can be produced inexpensively, that is protected against corrosion and at the same time has a good workability and weldability.

DESCRIPTION OF THE PREFERRED EMBODIMENTS

According to the invention, in order to produce a flat steel product that is formed from a base layer consisting of a steel material and a multilayer anticorrosion coating applied thereto, the following operating steps are carried out:

a) The base layer of the flat steel product consisting of steel material, is provided, wherein this base layer is a steel strip or steel sheet that until then is uncoated.
b) A zinc layer is applied by electrolytic coating to the base layer.
c) An at most 25 nm thick aluminium layer is applied to the surface of the zinc layer. Apart from the very small thickness of this Al layer, it is essential for the invention that the surface of the zinc layer as regards the oxides and sulphides present on it is left in the state existing at the end of the electrolytic zinc coating or occurring during the course of the aluminium coating as a result of the method. This means that the Al layer is applied directly to the Zn layer without carrying out beforehand a special cleaning or pretreatment of this layer aimed at removing oxides or sulphides. The aluminium applied to the Zn layer binds the Zn oxides and sulphides present there.

According to the invention therefore neither a plasma fine purification nor a special rinsing or a comparable cleaning method is carried out on the flat steel product provided with the Zn coating, before the Al layer is applied. Instead, according to the invention it is consciously accepted that oxides and/or sulphides are present on the surface of the Zn layer, which according to conventional ideas prevent the formation of a sufficiently securely adhering anticorrosion coating.

The omission according to the invention of any treatment of the surface of the zinc layer directed to removing oxides or sulphides considerably simplifies the method according to the invention compared to the known methods, in which such a treatment is regarded as absolutely essential.

d) After the application of the aluminium layer a magnesium layer is applied to the aluminium layer.

e) The thus applied coating formed from the Zn layer, the Al layer and the Mg layer is finally subjected to a thermal post-treatment. The operating parameters set in this connection are not narrowly restricted, but should simply be adjusted so that, as a result of the addition of heat directed to the surface of the coating above the Al layer, an $MgZn_2$ layer is formed in the coating.

Surprisingly it has been shown in fact that the thin Al layer lying between the Zn layer and the Mg layer allows a diffusion of the zinc into the magnesium layer. At the same time the Al layer acts as a coupling agent, which ensures that the coatings according to the invention, even without plasma fine purification and optimised temperatures of the thermal post-treatment or special rinsing conditions when rinsing the surface of the Zn layer before the application of the Mg layer, have an outstanding layer adhesion.

It is essential for the success of the invention therefore that the Al layer is applied so thinly that the diffusion of the Zn into the Mg can still take place through it. Al intermediate layers are know per se from the prior art, but are used there as diffusion barriers. Thus, for example, in hot-dip galvanising an AlFe intermediate layer is intentionally formed so as to prevent the diffusion of Zn and Fe.

Corresponding to the above explanations regarding the method according to the invention, a flat steel product according to the invention is formed from a base layer consisting of a steel material and a multilayer coating applied thereto, wherein the coating comprises according to the invention a Zn layer lying on the base layer, an $MgZn_2$ diffusion layer close to the surface, and an at most 25 nm thick Al layer lying between the Zn layer and the $MgZn_2$ diffusion layer. The thickness of the $MgZn_2$ layer of the coating of a flat steel product produced according to the invention is typically 400-2500 nm, an optimal protective effect being achieved with a thickness of 400-1000 nm.

A thin layer consisting exclusively of magnesium may also be present above the $MgZn_2$ layer, which as a rule occupies only the upper atomic layers however.

The invention thus includes a zinc-magnesium coating that is produced by first of all depositing on electrolytically coated steel sheet a thin aluminium layer to improve the adhesion. This is followed by application of a magnesium layer, which is then subjected to a thermal post-treatment. In the course of this thermal post-treatment an $MgZn_2$ phase is formed close to the surface. The thin aluminium layer having a thickness of less than 25 nm serves in this connection to improve the adhesion of the coating, without the need for a special cleaning of the surface of the zinc layer before the application of the Al layer. Similarly, there is no need to clean the Al layer before the magnesium is deposited on it.

A particularly more effective corrosion protection is achieved if a Zn layer consisting completely of high-purity, up to 99.9 wt. % zinc is formed in the course of the electrolytic Zn coating. In this connection it has been found that it is sufficient for the desired optimised corrosion protection with a coating formed and constituted according to the invention if the thickness of the electrolytically deposited Zn layer is 2-10 µm, wherein with regard to the weldability of flat steel products produced according to the invention it is expedient if the Zn layer is applied less than 8 µm thick to the base layer.

The action of the aluminium layer applied to the zinc layer that is utilised according to the invention then takes place particularly effectively if the Al layer is applied in a thickness of at least 8 nm to the zinc layer. The aluminium layer has an optimal effect if the thickness of the said aluminium layer is 8.5-13 nm.

Cathode sputtering methods, in particular magnetron sputtering, are particularly suitable as methods for depositing the thin Al layer. Regardless of which coating method is specifically used, the decisive advantage of the procedure according to the invention compared to the prior art is the fact that the applied Al leaves the plant with the flat steel product. In contrast to methods in which a plasma fine purification involving a removal of material has to be employed in order to ensure a sufficient adhesion of the ZnMg coating, with the method according to the invention neither removed oxides nor re-condensing metals endanger the operating result. Instead, the plant employed according to the invention for producing the Al layer can be operated free of malfunctions and interruptions over a long period of use.

Since the magnesium layer is applied in a thickness of 200-1500 nm to the aluminium layer, the protective effect of the Mg layer is reliably achieved. An optimal effect is then ensured at the same time if the layer thickness of the Mg layer applied to the Al layer is 300-800 nm before the subsequent thermal post-treatment.

In order to effect in an operationally reliable manner the diffusion of the zinc through the Al layer into the Mg layer occurring during the thermal post-treatment, the temperature of the thermal post-treatment should be 280-350° C., a post-treatment temperature of 325°±/−10° C. having been found to be particularly suitable. Typically the duration of the thermal treatment is 5-30 seconds.

The invention is described in more detail hereinafter with the aid of exemplary embodiments.

To demonstrate the action of the invention various experiments were carried out, whose general implementation can be described as follows:

A highly pure, 2.5 µm thick Zn layer consisting of 99.9 wt. % of zinc was deposited electrolytically in a continuous pass on a steel strip consisting of an IF steel of DC06 quality, forming the base layer of the flat steel product to be produced.

The steel strip thereby provided with a Zn coating was then immediately passed, without interrupting the continuous process conditions, directly to a conventional magnetron sputtering device, in which a thin Al layer was vapour deposited on the coating without prior removal of the oxides and/or sulphides present on its surface.

Following this the steel substrate coated with the Zn layer and the Al layer deposited thereon was then passed, in each case while maintaining the continuous process conditions, to a similarly conventional PVD coating plant (PVD="Physical Vapour Deposition"), in which a 300 nm thick Mg layer was deposited on the Al layer under a vacuum.

This was then finally followed in each case by a thermal post-treatment, in which the flat steel product consisting of the base layer formed from the steel material and the coating lying thereon and formed from the Zn layer, the Al layer and the Mg layer, was held for 10 sec at 320° C. In this way a layer structure was formed in the coating of the flat steel product, in which a layer consisting substantially of Zn was present on the steel base layer, on which lay a thin layer containing zinc oxides and sulphides, which in turn was covered by the Al layer. The Al layer was in its turn covered by an $MgZn_2$ layer, which was covered by a pure Mg layer a few layers of atoms thick.

The thickness of the Al layer of a first sample E1 according to the invention was adjusted to 8.5 nm by a corresponding setting of the output of the magnetron sputtering device. In a similar way the thickness of the Al layer of a second sample E2 according to the invention was adjusted to 10.5 nm and the thickness of the Al layer of a third sample E3 according to the invention was adjusted to 13 nm.

For purposes of comparison a first sample V1 not according to the invention was provided in a conventional manner with a ZnMg coating by electrolytic galvanising, followed by plasma fine purification and deposition of an Mg layer by a PVD method and then thermal post-treatment at 320° C.

Likewise, for purposes of comparison a second sample V2 not according to the invention had been provided in a conventional manner with a ZnMg coating by electrolytic galvanising and deposition of an Mg layer by a PVD method and subsequent thermal post-treatment at 320° C. Before the application of the Mg layer no treatment was carried out in this case to remove the oxides and sulphides present on the Zn layer.

As first investigation an adhesive bead bending test was carried out on the samples E1, E2, E3, V1, V2. For this, about 150 mm long strips of the respective sample material were used.

After a defined oiling an adhesive bead of a conventional adhesive obtainable under the trade name Betamate 1496 was applied in each case to these strips.

Once the adhesive had hardened the strip was first of all suddenly bent at room temperature RT about an axis aligned transversely to its longitudinal length. Corresponding samples were then deformed in the same way at −20° C. In the course of the respective deformation a delamination and fracture of the adhesive occurred.

The surface of the samples from which the adhesive had delaminated was then visually assessed. In this connection a distinction was made between whether the delamination had occurred within the metallic coating (so-called "delamination fracture"="DF") or either between the adhesive and metallic surface or within the adhesive (so-called "mixed fracture"="MF"). The proportions of the fracture surface of the adhesive beads of the respective samples were likewise visually determined. A delamination fracture proportion of more than 5% at room temperature was regarded as undesirable, since it is indicative of adhesion problems of the coating. The results of the evaluations that were thus carried out are summarised in Table 1.

TABLE 1

|    | DF | MF | DF | MF |
|----|----|----|----|----|
|    | \multicolumn{4}{c}{Temperature:} | | | |
|    | RT | RT | −20° C. | −20° C. |
|    | \multicolumn{4}{c}{Fracture surface proportions} | | | |
| V1 | 0% | 100% | 0% | 100% |
| V2 | 40% | 60% | 95% | 5% |
| E1 | 0% | 100% | 5% | 95% |
| E2 | 0% | 100% | 5% | 95% |
| E3 | 0% | 100% | 20% | 80% |

The results show that in the case of the comparison variant V1, which had undergone a plasma fine purification before the application of the Mg layer, there is up to 100% mixed fracture.

If the plasma fine purification is omitted, then the comparison experiment V2 shows that in this case, without the thin aluminium layer according to the invention, at room temperature there is already a high delamination fracture proportion, which at −20° C. rises to more than 90%.

The experiments carried out with the samples E1-E3 according to the invention prove on the other hand that very thin Al layers ca. 8.5 nm thick have at room temperature a mixed fracture proportion of 100%, which is more than 90% even at −20° C. Accordingly the Al layer provided according to the invention between the Zn and Mg layers leads to a significant improvement compared to the comparison variants V1, V2.

In addition tensile shear tests were carried out on further samples E1-E3 and V1, V2.

In the tensile shear test two strips are bonded to one another, the adhesive Betamate 1496 also being used in this case. The samples bonded together were then subjected to tensile stress at room temperature and −20° C. until the bonding site fractured.

This test was carried out on a first portion of the samples E1-E3 and V1, V2 a short time after the bonding, and on another portion of the samples E1-E3, V1, V2 only after 30 days' ageing.

In the Tables 2-5 shown hereinafter the abbreviations have the following meanings.

"SF": Fracture in the steel base material,
"DF": Delamination fracture, i.e. separation in the coating,
"AF": Adhesion fracture, i.e. separation between the adhesive and surface,
"SCF": Cohesion fracture near the surface, i.e. fracture in the adhesive near the surface,
"CF": Cohesion fracture, i.e. fracture in the adhesive.

The fracture surface proportions determined in the tensile shear tests carried out at room temperature immediately after the bonding are shown in Table 2.

TABLE 2

| Samples | CF | SCF | AF | DF | SF |
|---------|----|----|----|----|----|
|         | \multicolumn{5}{c}{Fracture surface proportions (%)} | | | | |
| V1 | 0 | 70.8 | 29.2 | 0 | 0 |
| V2 | 0 | 62.3 | 17.5 | 20.2 | 0 |
| E1 | 0 | 84.2 | 13.3 | 2.5 | 0 |
| E2 | 0 | 75.2 | 24.8 | 0 | 0 |
| E3 | 0 | 83.2 | 16.8 | 0 | 0 |

The fracture surface proportions that were determined in tensile shear tests carried out at room temperature after storage for 30 days after the bonding are shown in Table 3.

TABLE 3

| Samples | CF | SCF | AF | DF | SF |
|---|---|---|---|---|---|
| | Fracture surface proportions (%) | | | | |
| V1 | 14.2 | 70 | 15.8 | 0 | 0 |
| V2 | 6.7 | 48.3 | 3.3 | 41.7 | 0 |
| E1 | 10 | 63.3 | 2.5 | 24.2 | 0 |
| E2 | 12.5 | 66.7 | 5.8 | 15 | 0 |
| E3 | 6.7 | 80.8 | 7.5 | 5 | 0 |

The fracture surface proportions determined in tensile shear tests carried out at −20° C. immediately after the bonding are shown in Table 4.

TABLE 4

| Samples | CF | SCF | AF | DF | SF |
|---|---|---|---|---|---|
| | Fracture surface proportions (%) | | | | |
| V1 | 0 | 50 | 50 | 0 | 0 |
| V2 | 0 | 15 | 1.7 | 83.3 | 0 |
| E1 | 0 | 25 | 35 | 40 | 0 |
| E2 | 0 | 39.5 | 52.8 | 7.7 | 0 |
| E3 | 0 | 30 | 65.8 | 4.2 | 0 |

The fracture surface proportions that were determined in tensile shear tests carried out at −20° C. after storage for 30 days after the bonding are shown in Table 5.

TABLE 5

| Samples | CF | SCF | AF | DF | SF |
|---|---|---|---|---|---|
| | Fracture surface proportions (%) | | | | |
| V1 | 0 | 85 | 0 | 15 | 0 |
| V2 | 0 | 22 | 0 | 78 | 0 |
| E1 | 0 | 40 | 0 | 60 | 0 |
| E2 | 0 | 61.7 | 0 | 38.3 | 0 |
| E3 | 0 | 65 | 0 | 35 | 0 |

The results of the tensile shear test show a clear trend. In the comparison Example V2 obtained without plasma fine purification, a significant delamination fracture proportion occurs under all experimental conditions, and reaches an undesirable magnitude.

In the comparison Example V1 produced with plasma fine purification such a proportion occurs at −20° C. only after 30 days.

The deposition of a thin aluminium layer leads on the other hand to a significant improvement, since the delamination proportion in each of the investigated samples E1-E3 according to the invention is less. The influence of the thickness of the aluminium layer is striking in this case. Under all experimental conditions the delamination proportion decreases with increasing thickness of the aluminium layer.

The invention claimed is:

1. A method for the production of a flat steel product that is formed from a base layer consisting of a steel material and a multilayer anticorrosion coating applied thereto, comprising the following operating steps:
   providing the base layer;
   applying a zinc layer to the base layer by electrolytic deposition;
   applying an aluminium layer directly to the as-deposited surface of the zinc layer;
   applying a magnesium layer to the aluminium layer; and
   thermally post-treating the flat steel product provided with the coating formed from the zinc layer applied to the base layer, the aluminium layer and the magnesium layer, in such a way that an MgZn$_2$ layer is formed in the coating above the Al layer,
   wherein the aluminium layer has a maximum thickness of 25 nm.

2. The method according to claim 1, wherein the zinc layer comprises up to 99.9 wt. % of Zn.

3. The method according to claim 1, wherein the zinc layer is applied in a thickness of 2-10 μm to the base layer.

4. The method according to claim 3, wherein the zinc layer is applied in a thickness of less than 8 μM to the base layer.

5. The method according to claim 1, wherein the aluminium layer is applied in a thickness of at least 8 nm to the zinc layer.

6. The method according to claim 5, wherein the aluminium layer applied to the zinc layer is 8.5-13 nm thick.

7. The method according to claim 1, wherein the aluminium layer is applied by a cathode sputtering method.

8. The method according to claim 1, wherein the magnesium layer is applied in a thickness of 200-1500 nm to the aluminium layer.

9. The method according to claim 8, wherein the magnesium layer applied to the aluminium layer is 300-800 nm thick.

10. The method according to claim 1, wherein the temperature of the thermal post-treatment is 280° C.-350° C.

11. The method according to claim 1, wherein the Al layer is applied to the Zn layer immediately after electrolytic deposition of the Zn layer without any further processing of the Zn layer prior to application of the Al layer.

12. A flat steel product, comprising:
   a base layer consisting of a steel material; and
   a multilayer coating applied thereto, wherein the coating comprises a Zn layer covering the base layer, Al layer covering the Zn layer, and a MgZn$_2$ diffusion layer covering the Al layer.

13. The flat steel product according to claim 12, wherein the thickness of the MgZn$_2$ layer is 400-2500 nm.

14. The flat steel product according to claim 12, wherein it is produced by a method carried out according to claim 1.

* * * * *